(12) United States Patent
Chang et al.

(10) Patent No.: US 11,262,658 B2
(45) Date of Patent: Mar. 1, 2022

(54) PHOTOMASK, PHOTOLITHOGRAPHY SYSTEM AND MANUFACTURING PROCESS

(71) Applicant: Taiwan Semiconductor Manufacturing Co., Ltd., Hsinchu (TW)

(72) Inventors: Che-Yuan Chang, Hsinchu (TW); Chih-Chiang Tu, Taoyuan (TW); Ming-Ho Tsai, Hsinchu (TW); Ching-Hung Lai, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 57 days.

(21) Appl. No.: 16/860,080

(22) Filed: Apr. 28, 2020

(65) Prior Publication Data

US 2021/0333705 A1    Oct. 28, 2021

(51) Int. Cl.
| | | |
|---|---|---|
| *G03F 7/20* | (2006.01) | |
| *G03F 1/36* | (2012.01) | |
| *G03F 1/70* | (2012.01) | |
| *G03F 1/82* | (2012.01) | |

(52) U.S. Cl.
CPC .............. *G03F 7/2004* (2013.01); *G03F 1/36* (2013.01); *G03F 1/70* (2013.01); *G03F 1/82* (2013.01); *G03F 7/2002* (2013.01)

(58) Field of Classification Search
CPC ..... G03F 1/36; G03F 1/70; G03F 1/82; G03F 7/2002; G03F 7/2004
USPC ............................................................ 430/5
See application file for complete search history.

(56) References Cited

U.S. PATENT DOCUMENTS

| | | |
|---|---|---|
| 8,762,900 B2 | 6/2014 | Shin et al. |
| 8,796,666 B1 | 8/2014 | Huang et al. |
| 8,812,999 B2 | 8/2014 | Liu et al. |
| 8,850,366 B2 | 9/2014 | Liu et al. |
| 8,906,595 B2 | 12/2014 | Liu et al. |
| 8,954,899 B2 | 2/2015 | Wu et al. |
| 9,093,530 B2 | 7/2015 | Huang et al. |
| 9,367,655 B2 | 6/2016 | Shih et al. |
| 9,390,217 B2 | 7/2016 | Wang et al. |
| 9,548,303 B2 | 1/2017 | Lee et al. |

*Primary Examiner* — Christopher G Young
(74) *Attorney, Agent, or Firm* — JCIPRNET

(57) ABSTRACT

A photomask includes a transparent substrate and a shielding pattern disposed on the transparent substrate. The shielding pattern includes shielding island structures. The shielding island structures are separated from and spaced apart from one another by dividing lanes. The dividing lanes expose the underlying transparent substrate. The photomask is configured for a light of a wavelength, and the dividing lanes reduce or hinder a transmission of the light of the wavelength.

20 Claims, 8 Drawing Sheets

PHOTOMASK, PHOTOLITHOGRAPHY SYSTEM AND MANUFACTURING PROCESS

BACKGROUND

In semiconductor fabrication, photomasks are used during photolithography process to render patterns on a semiconductor substrate. However, during the exposure process, the illumination would cause electro-static discharge (ESD) such that charges are accumulated at a certain area of the photomask. As a result, the photomask is damaged and the lifetime thereof is shortened.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
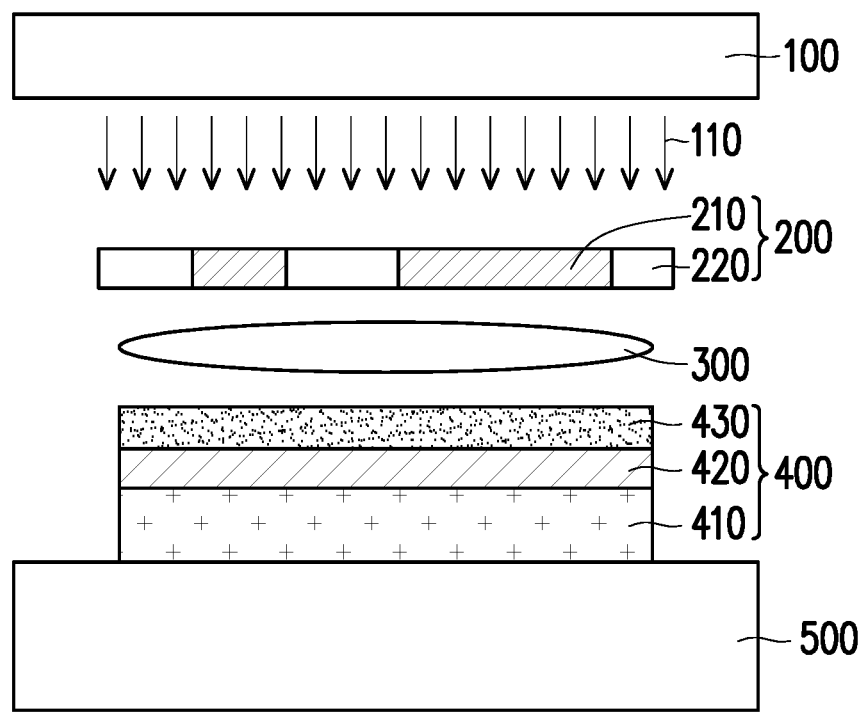
FIG. 1 is a schematic view illustrating a photolithography system in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic view illustrating a photolithography system 10. The photolithography system 10 may be utilized in the fabrication of a variety of semiconductor devices, such as memory devices (including but not limited to a static random access memory (SRAM)), logic devices (including but not limited to a metal-oxide semiconductor field-effect transistor (MOSFET)), and/or other devices. In one embodiment, the photolithography system 10 is configured to transfer a pattern of the photomask 200 onto the photoresist layer 430.

Referring to FIG. 1, the photolithography system 10 includes a light source 100, a photomask 200, a lens 300, a target 400, a carrier stage 500.

The light source 100 is configured to emit an electromagnetic radiation 110 for photolithography. The electromagnetic radiation 110 is, for example, the ultraviolet (UV) light or deep UV light. The light source 100 may emit an electromagnetic radiation 110 having a wavelength ranges between 13.5 nm and 365 nm. In some embodiments, the wavelength of the electromagnetic radiation 110 may be 13.5 nm, 193 nm, 248 nm, or 365 nm based on the fabrication requirements. It should be noted that the wavelength of the electromagnetic radiation 110 emitted by the light source 100 is not limited to the foregoing values. In some alternative embodiments, the electromagnetic radiation 110 may be extended to include other radiation beams such as ion beam, x-ray, extreme ultraviolet light, and other radiation energy based on the resolution requirements.

The carrier stage 500 is located below the light source 100. The carrier stage 500 is configured to carrier the target 400. In some embodiments, the target 400 includes a target substrate 410, a conductive material layer 420, and a photoresist layer 430. The target substrate 410 is located on the carrier stage 500. In some embodiments, the target substrate 410 is a bulk semiconductor substrate, a glass substrate, or any other suitable dielectric material substrate. The conductive material layer 420 and the photoresist layer 430 are located on the target substrate 410. The material of the conductive material layer 420 includes, for example, a metal, a semiconductor material, a metal oxide, a metal nitride, or other electrically conductive materials. The conductive material layer 420 may be a single-layered structure or a multi-layered structure. In some embodiments, the conductive material layer 420 is formed on the target substrate 410 by sputtering, plating deposition, or thermal oxidation. In some embodiments, the photoresist layer 430 is made from a photosensitive material and formed over the conductive material layer 420 and the target substrate 410. The photoresist layer 430 may be formed by spin-on coating, lamination and/or other processes. In some embodiments, a photoresist solution is dispensed onto the surface of the conductive material layer 420. The conductive material layer 420 having photoresist solution dispensed thereon is spun rapidly until the photoresist solution is almost dry. In some embodiments, the photoresist layer 430 may be a chemically amplified resist that employs acid catalysis. For example, the photoresist layer 430 may be formulated by dissolving an acid sensitive polymer in a casting solution.

In some embodiments, the photomask 200 is located between the light source 100 and the carrier stage 500. In some embodiments, the photomask 200 includes a transparent substrate 220 and a light shielding layer 210 disposed over the transparent substrate 220. In some embodiments, the light shielding layer 210 is disposed on a side of the transparent substrate 220 facing the light source 100. In another embodiment, the light shielding layer 210 is disposed on another side of the transparent substrate 220 facing the carrier stage 500. The transparent substrate 220 includes material substantially free of defects, such as fused silica ($SiO_2$), quartz, calcium fluoride, or other suitable material.

In some embodiments, the photomask 200 is disposed between the light source 100 and the carrier stage 500 and aligned with the light source 100. Moreover, in some embodiments, the photomask 200 may be fixed between the light source 100 and the carrier stage 500 by a mask holder (not illustrated). In some embodiments, the material of the light shielding layer 210 includes Cr, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or other suitable materials, or combinations thereof. A thickness of the light shielding layer 210 may be approximately 50 nm to 200 nm. The configuration and the layout of the light shielding layer 210 will be discussed in greater detail later.

In some embodiments, the electromagnetic radiation 110 (such as the UV light) emitted by the light source 100 passing through the photomask 200 to transfer the pattern of the photomask 200 (i.e. the pattern defined by the light shielding layer 210) to the underlying photoresist layer 430. In some embodiments, the electromagnetic radiation 110 passing through the photomask 200 is focused by a lens 300 located between the photomask 200 and the photoresist layer 430, and the focused light reaches the photoresist layer 430 and then the pattern of the photomask 200 is transferred to the photoresist layer 430. Upon irradiation by the electromagnetic radiation 110, the photoresist layer 430 is partially exposed, and the exposed portion(s) of the photoresist layer 430 may be further reacted and crosslinked to become dissoluble or indissoluble depending on the type of the photoresist layer 430.

In some embodiments, the photomask 200 may be covered by a pellicle membrane (not shown), which serves as a protective cover to protect the UV mask or the extreme UV (EUV) mask from damage and/or contaminant particles. During lithography processes, the pellicle membrane may be supported by with a mesh structure (e.g., like a bee hive) or may be bonded to a temporary bonding layer in order to prevent or minimize damage to the pellicle membrane.

In some embodiments, the photomask 200 is used to transfer patterns for fabricating integrated circuits over the semiconductor substrate. In some alternative embodiments, the photomask 200 may be used to pattern other substrates such as a glass substrate used to form a thin film transistor liquid crystal display (TFT-LCD) substrate.

FIG. 2A and FIG. 3 to FIG. 5 are schematic top views illustrating a patterning process in accordance with some embodiments of the disclosure.

Figure 2A:
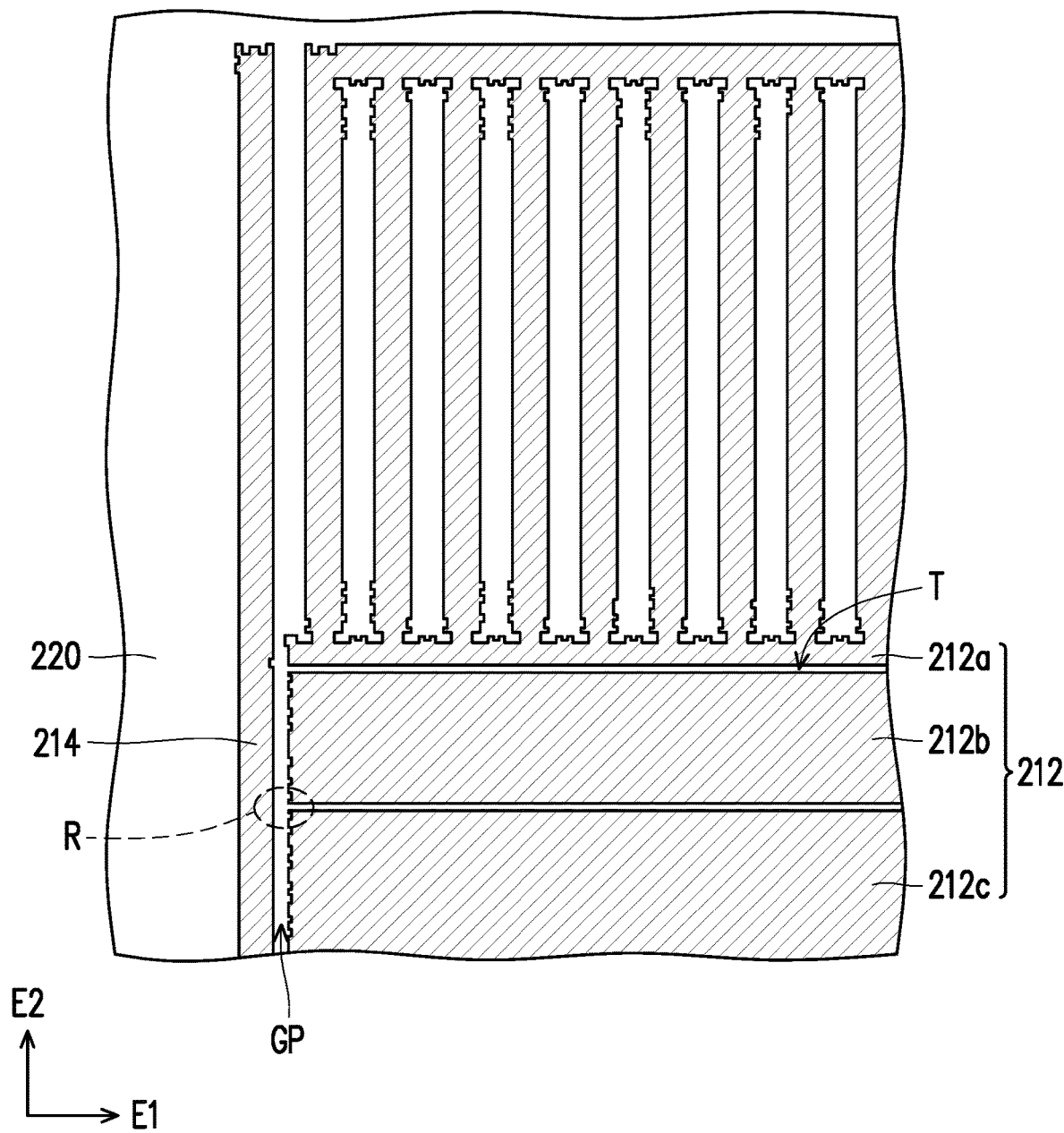
FIG. 2A and FIG. 3 to FIG. 5 are schematic top views illustrating a pattern transferring process using a photomask in accordance with some embodiments of the disclosure.
Figure 2B:
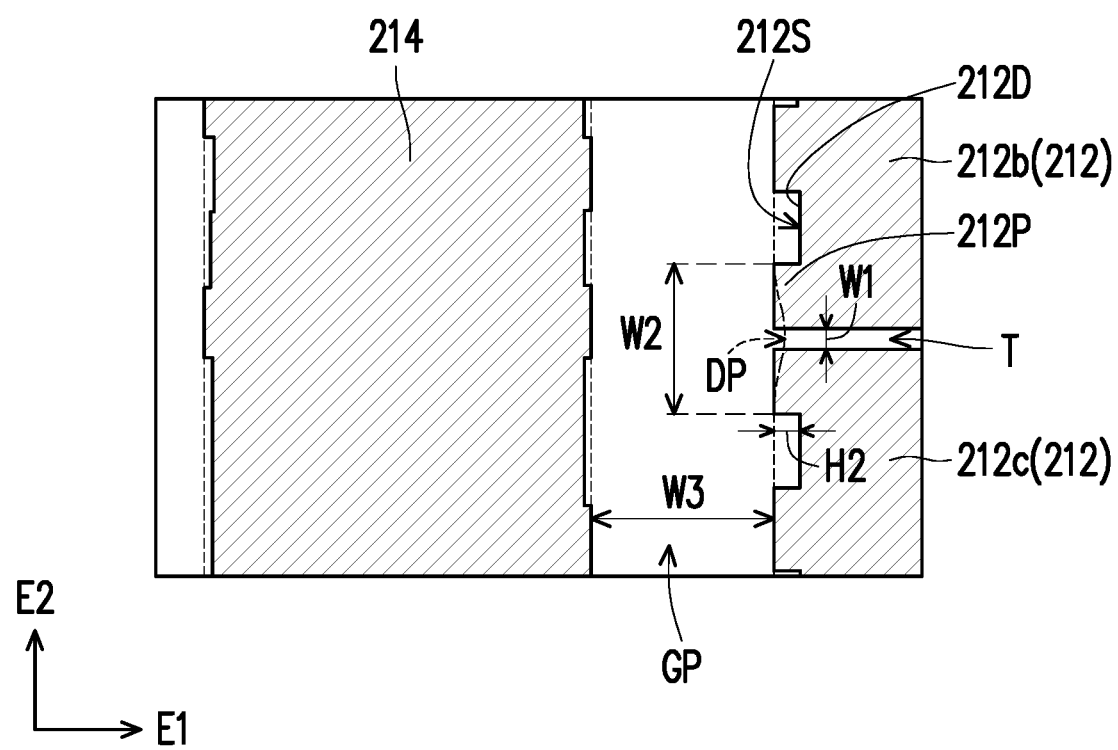
FIG. 2B is an enlarged view of a region of the photomask depicted in FIG. 2A.
Figure 3:
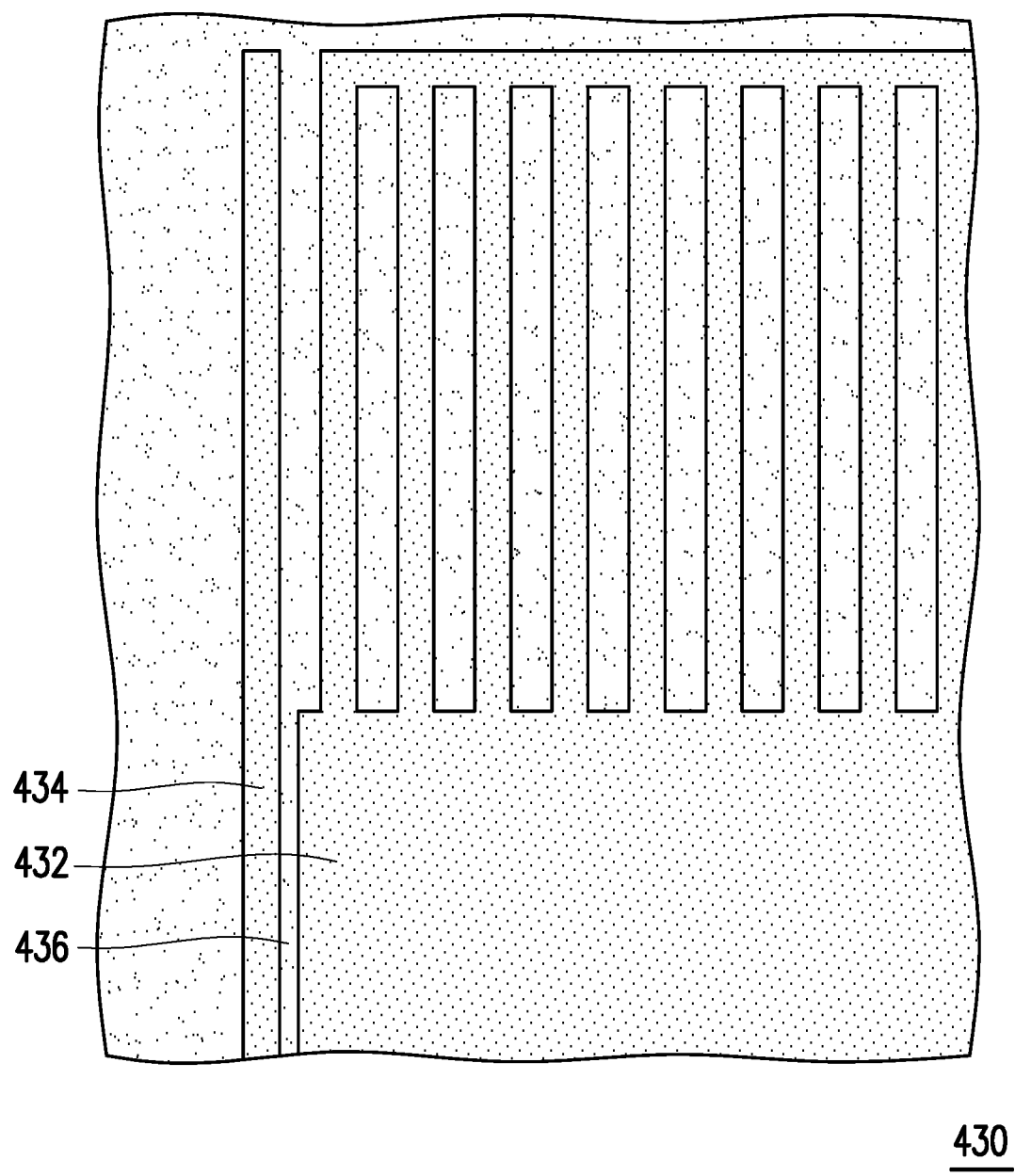

FIG. 2A is a schematic top view illustrating the photomask 200 in accordance with some embodiments of the disclosure. FIG. 3 is a schematic top view illustrating the photoresist layer 430 after using the photomask in the exposure process. FIG. 2B is an enlarged view of a region R of the photomask 200 depicted in FIG. 2A. After exposing the photoresist layer to the radiation passing through the photomask, the transferred pattern(s) of the photoresist layer 430 is shown in FIG. 2B. In some embodiments, the dimensions of the transferred pattern of the photoresist layer 430 are reduced (i.e. shrunk) by the lens 300. For example, the critical dimension of a feature in the transferred pattern in the photoresist layer may be shrunk by four times when compared with the critical dimension of a feature in the photomask pattern, depending on the amplification or reduction times of the lens 300.

The transferred pattern as shown in FIG. 2B substantially corresponds to the pattern of the light shield layer 210 shown in FIG. 2A. For comparison, FIG. 2B illustrates the shapes and positions of the patterns of the photomask 200 relative to the desired pattern DP (to be transferred pattern) transferred to the photoresist layer 430.

Referring to FIGS. 1, 2A, 2B, and 3, in some embodiments, the light shielding layer 210 includes a first shielding pattern 212 and a second shielding pattern 214. The first shielding pattern 212 and the second shielding pattern 214 are located over the transparent substrate 220 and shield the transparent substrate 220 from the electromagnetic radiation 110 (or from the light). During the exposure process, an electromagnetic radiation 110 is irradiating onto the photomask 200 and passes through the photomask 200 to define an exposed pattern 436, a first unexposed pattern 434, and a second unexposed pattern 432 in a photoresist layer 430. In other word, the exposed pattern 436, the first unexposed pattern 432 and the second unexposed pattern 434 are transferred to the photoresist layer 430. The first unexposed pattern 432 is derived from and corresponds to the first shielding pattern 212 of the photomask 200. The second unexposed pattern 434 is derived from and corresponds to the second shielding pattern 214 of the photomask 200.

In some embodiments, the first shielding pattern 212 includes multiple parts or blocks 212a, 212b and 212c, divided and separated by dividing lanes T. The dividing lanes T are void streets exposing the underlying transparent substrate 220. In some embodiments, the parts or blocks 212a, 212b, 212c in the first shielding pattern 212 may have different areas, design or shapes. In some embodiments, some of the parts or blocks 212a, 212b, 212c in the first shielding pattern 212 include a plurality of shielding island structures separated from and spaced apart from one another by the dividing lanes T. In some embodiments, in FIG. 2B, the blocks 212b and 212c are opaque shielding island structures separating by the diving line T.

In some embodiments, the smaller the wavelength of the electromagnetic radiation 110 emitted from the light source 100 is, the smaller the width of the dividing lanes T is. In other words, the width of the dividing lanes T depends on the wavelength of the electromagnetic radiation 110. Moreover, as mentioned above, the patterns (the first shielding pattern 212 and the second shielding pattern 214) of the photomask 200 are shrunk and transferred onto the photoresist layer 430 with the aid of lens 300. Therefore, the width of the dividing lanes T may also be adjusted based on the lens resolution and/or magnification/minification power. Suitable width of the dividing lanes T may be selected based on the photolithography system 10. For example, a width W1 of the dividing lanes T is equal to or smaller than a critical dimension (CD) of the photomask 200. For semiconductor manufacturing, the critical dimension (CD) of the device is the characteristic size (or minimum size) of a feature on an integrated circuit or transistor that impacts the electrical properties of the device. For photolithography, the critical dimension of the photomask is the minimum size of a feature to be patterned or defined in the mask. The critical dimension of the photomask 200 may be defined by the wavelength of the electromagnetic radiation or light as well as the amplification or reduction times of the lens. In some embodiment, the critical dimension of the photomask 200 may be defined by Rayleigh criterion which is presented as $CD=k1\times(\lambda/NA)$, wherein the amplification or reduction times of the lens is included in k1. Due to the functioning of the lens, the critical dimension of the photomask may be different from the critical dimension of the feature in the fabricated device. In some embodiments, the size of the transferred pattern in the photoresist layer 430 may be reduced by four time through the function of the lens 300 relative to the size of the mask pattern.

In some embodiments, the electromagnetic radiation used in the exposure process is the deep ultraviolet light, and the critical dimension (CD) of the photomask 200 is in a range between 50 nm to 200 nm. In some embodiments, the width W1 of the dividing lane T is in a range between 10 nm to 16 nm. Since the width of the dividing lane T is smaller or less than the wavelength of the light source or the resolution limit of the imaging system and diffraction may occur, the light cannot directly pass through the dividing lanes and a transmission of the light is reduced or hindered by the dividing lanes T. That is, the light does not effectively pass through the dividing lanes T and the patterns of the dividing lanes T are not transferred onto the photoresist layer 430. As a result, the first unexposed pattern 432 is formed as one integral piece and corresponds to the whole of the dividing lanes and the shielding island structures of the first shielding pattern 212.

In some embodiments, the dividing lanes T are intersected with each other, and the light may pass through the intersections of the dividing lanes T. As a result, the patterns of the dividing lanes T are not transferred but patterns of the intersections of the dividing lanes T may be transferred onto the photoresist layer 430, leading to an array pattern. Therefore, by forming the dividing lanes T parallel to each other without intersections, such array pattern corresponding to the intersections of the dividing lanes T will not be formed in the photoresist layer 430.

During the exposure process, charges are likely to accumulate at the edges of the light shielding layer 210 in the photomask 200, especially at the edges of certain areas of the first shielding pattern 212 which has areas larger than, for example, about 500 $\mu m^2$, in the light shielding layer 210. However, with the aid of the dividing lanes T, the large areas of the first shielding pattern 212 are divided into a plurality of smaller parts or blocks 212a, 212b, 212c, so that the charge accumulation may be alleviated, thereby reducing the electro-static discharge (ESD) of the photomask 200. In some embodiments, the first shielding pattern 212 has no area larger than about 500 $\mu m^2$. In some embodiments, each of the shielding island structures 212b, 212c has an area smaller than about 500 $\mu m^2$.

A gap GP is located between the second shielding pattern 214 and the first shielding pattern 212. In some embodiments, a width W3 of the gap GP is larger than the critical dimension (CD) of the photomask 200 and is larger than the width W1 of the dividing lane T. That is, the light can pass through the gap GP and reach the underlying photoresist layer, so that the pattern of the gap GP can be transferred onto the photoresist layer 430 after the exposure process. In some embodiments, an extending direction E1 of the dividing lanes T is different from (e.g. perpendicular to) an extending direction E2 of the gap GP, and the dividing lanes T are jointed with the gap GP.

Referring to FIG. 2B, the photomask 200 undergoes an optical proximity correction (OPC) to reduce the optical proximity effect (OPE). The optical proximity correction (OPC) is directed to eliminate the CD deviation because of the proximity effect. For example, the line width of the desired pattern to be exposed onto the photoresist layer is reduced or increased so as to make sure that the transferred pattern has the desired line widths. In some embodiments, the contour of the first shielding pattern 212 has a different shape from the shape of the contour of the first unexposed pattern 432. In some embodiments, the shape of the contour of the second shielding pattern 214 is different from the shape of the contour of the second unexposed pattern 434. The first shielding pattern 212 includes recessed regions 212D and non-recessed regions 212P located at a side of the first shielding pattern 212. In some embodiments, the blocks 212b, 212c include recessed regions 212D having concave side 212S recessing inward from the border (represented by the dotted line) of the desired pattern DP (relative to the border of the exposed pattern). In some embodiments, the recess regions 212D are designed to be adjacent to the joining locations of the dividing lanes T to the gap GP. In some embodiments, sandwiched between the ends of the dividing lanes T and the recess regions 212D are the non-recessed regions 212P. Through such design, the optical proximity effect caused by the dividing lane T can be alleviated through the recessed regions 212D. In some embodiments, an end of the dividing lane T is located between two of the none-recessed regions 212P. In some embodiments, a width W2 between the recessed regions 212D is in a range between 20 nm to 100 nm, and the height H2 of the recessed region 212D is in a range between 0 nm to 50 nm.

Figure 4:
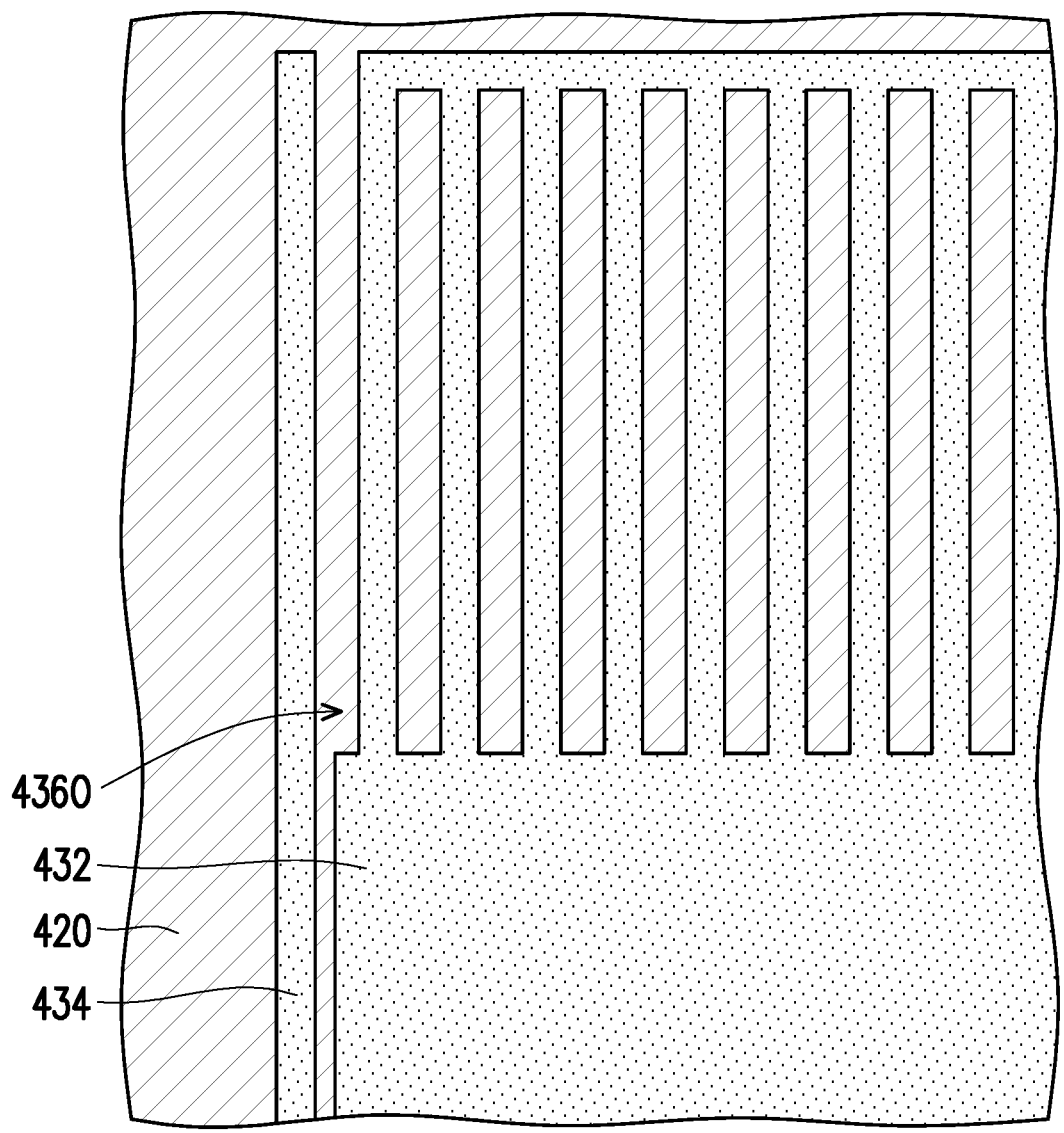

Referring to FIG. 4, a development process is performed to the photoresist layer 430. In some embodiments, the photoresist layer 430 is a positive tone photoresist, and the exposed pattern 436 is removed after the development process. In some alternative embodiments, the photoresist layer 430 is a negative tone photoresist, and the first unexposed pattern 432 and the second unexposed pattern 434 are removed after the development process.

The photoresist layer 430 may be developed by applying a developer to form patterns corresponding to the shielding part(s) of the conductive material 420. In this embodiment, the photoresist layer 430 is a positive tone photoresist, and a hole 4360 corresponding to the exposed pattern 436 is formed in the photoresist layer 430 after the development process. In some alternative embodiments, the photoresist layer 430 is a negative tone photoresist, and a hole corresponding to the first unexposed pattern 432 and a hole corresponding the second unexposed pattern 434 are formed in the photoresist layer 430 after the development process.

Figure 5:
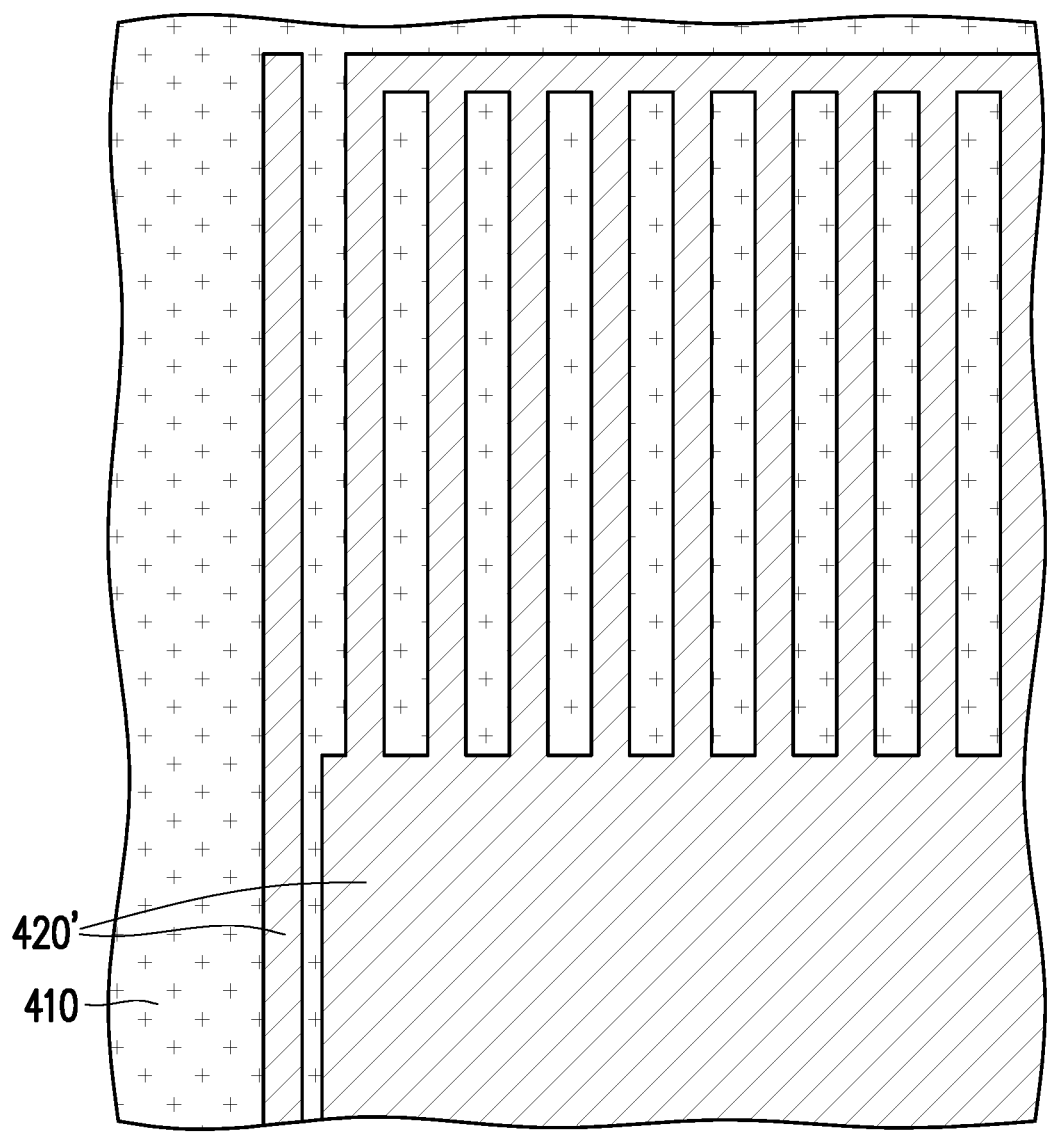

Referring to FIG. 5, an etching process is performed to the conductive material 420. A portion of the conductive material 420 that corresponds to the exposed pattern 436 and overlaps with the hole 4360 is removed to form a conductive pattern 420' which may be an integrated circuit pattern. In some embodiments, the etching process may be a wet etch process or a dry etch process.

The remaining photoresist layer 430 may be removed by wet stripping or plasma ashing. It should be noted that the pattern of the first shielding layer 212 and the pattern of the second shielding layer 214 are shrunk and transferred onto the photoresist layer 430 with the aid of lens. In other words, a size of the first shielding layer 212 and a size of the second shielding layer 214 are larger than a size first unexposed pattern 432 and a size of the second unexposed pattern 434.

In this embodiment, the photoresist layer 430 is a positive tone photoresist, and a pattern of a conductive pattern may be similar with the pattern of the first shielding layer 212 and the pattern of the second shielding layer 214. The sizes of the first unexposed pattern 432 and the second unexposed pattern 434 are similar to a size of the conductive pattern. In some alternative embodiments, the photoresist layer 430 is a negative tone photoresist, and a pattern of a conductive pattern 420' may be similar with a pattern of the exposed pattern 436.

Figure 6:
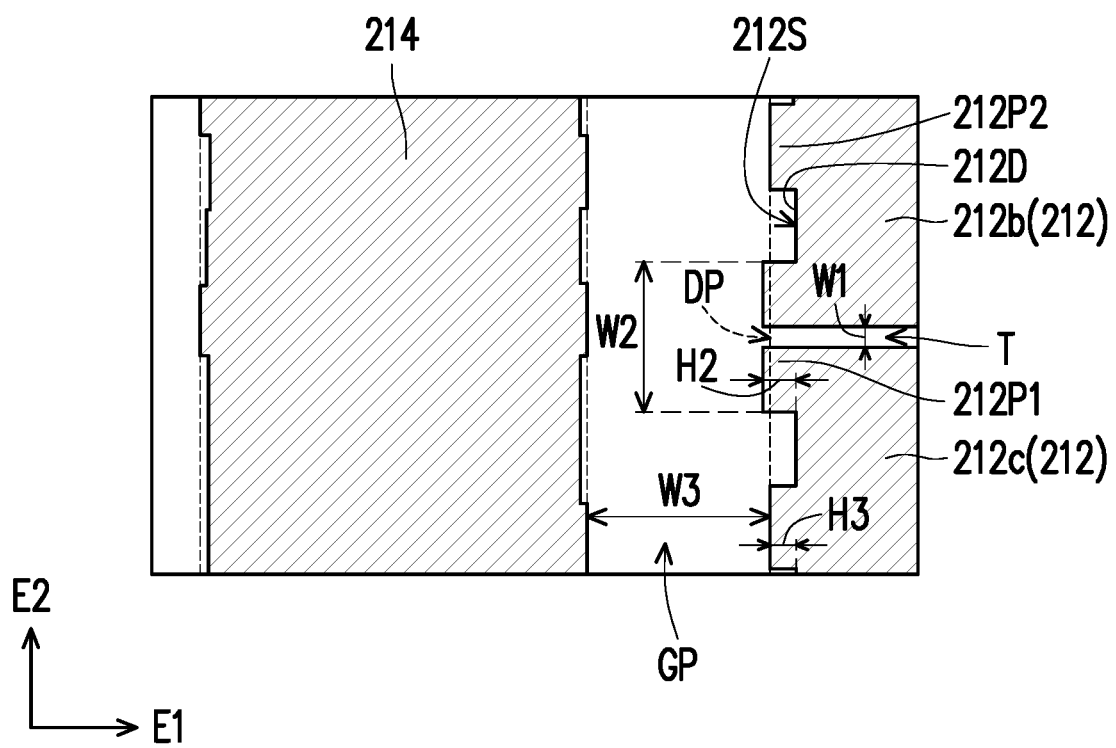
FIG. 6 is a schematic top view illustrating a portion of a photomask in accordance with some embodiments of the disclosure.

FIG. 6 is a schematic top view illustrating a portion of a photomask in accordance with some embodiments of the disclosure. For comparison, FIG. 6 illustrates the shapes and positions of the patterns of the photomask 200 relative to the desired pattern DP (to be transferred pattern) transferred to the photoresist layer 430.

Referring to FIG. 6, optical proximity effect correction (OPC) patterns are added on the photomask 200 so as to reduce the optical proximity effect of the dividing lane T. The first shielding pattern 212 includes recessed regions 212D, non-recessed regions 212P1, and the non-recessed regions 212P2 located at a side of the first shielding pattern 212. In some embodiments, the blocks 212b, 212c include recessed regions 212D having concave side 212S recessing inward from the border (represented by the dotted line) of the desired pattern DP (relative to the border of the exposed pattern). At least a part of the recess regions 212D is located between the non-recessed regions 212P1 and the non-recessed regions 212P2. In some embodiments, the recess regions 212D are designed to be adjacent to the joining locations of the dividing lanes T to the gap GP. In some embodiments, the recess regions 212D are designed to be adjacent to the joining locations of the dividing lanes T to the gap GP. Sandwiched between the ends of the dividing lanes T and the recess regions 212D are the non-recessed regions 212P1. That is, an end of the dividing lane T is located between two of the none-recessed regions 212P1. The two of the none-recessed regions 212P1 are more protruding than the adjacent non-recessed regions 212P2. That is, the height H2 of the non-recessed regions 212P1 is larger than the height H3 of the non-recessed regions 212P2. Since the height H2 of the non-recessed regions 212P1 is larger than the height H3 of the non-recessed regions 212P2, the optical proximity effect caused by the dividing lane T can be better alleviated. In some embodiments, the non-recessed regions 212P1 may be a multi-stage stepped structure. That is, the non-recessed regions 212P1 may have a shape different from the shape of the non-recessed regions 212P2.

In some embodiments, the height H2 of the non-recessed regions 212P1 is in a range between 20 nm to 100 nm, and the height H3 of the adjacent non-recessed regions 212P2 is in a range between 0 nm to 50 nm.

Figure 7:
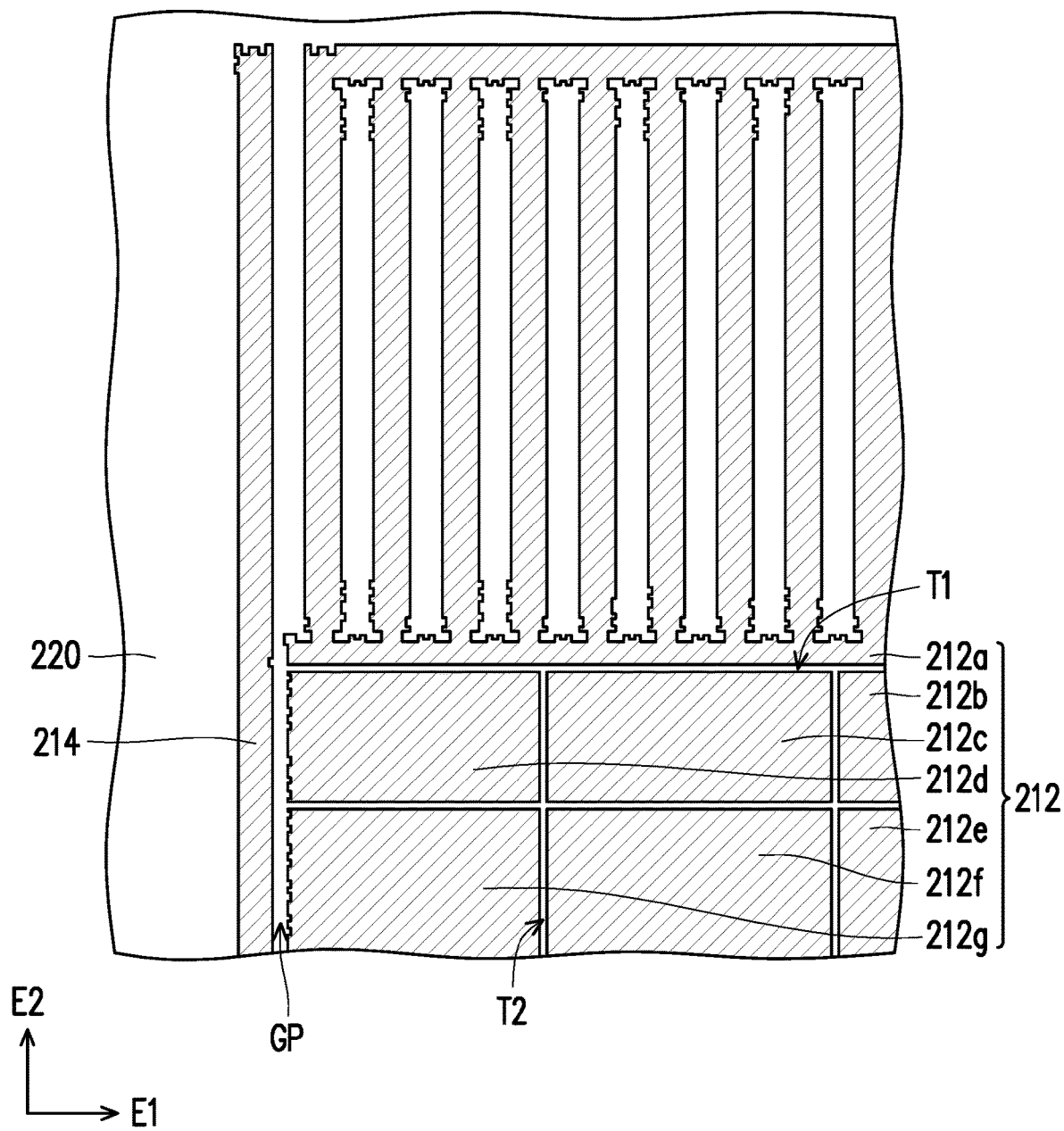
FIG. 7 is a schematic top view illustrating a portion of a photomask in accordance with some embodiments of the disclosure.

FIG. 7 is a schematic top view illustrating a portion of a photomask in accordance with some embodiments of the disclosure.

Referring to FIG. 7, the first shielding pattern 212 has dividing lanes T1 and dividing lanes T2 dividing it into a plurality of parts 212a, 212b, 212c, 212d, 212e, 212f, and 212g. The dividing lanes T1 are intersected and joined with the dividing lanes T2. In some embodiments, an extending direction E1 of the dividing lanes T1 is perpendicular with an extending direction E2 of the dividing lanes T2. The parts 212b, 212c, 212d, 212e, 212f, and 212g of the first shielding pattern 212 are shielding island structures 212b, 212c, 212d, 212e, 212f, and 212g and are opaque.

In some embodiments, the smaller the wavelength of the electromagnetic radiation 110 emitted from the light source 100 is, the smaller the width of the dividing lanes T1, T2 is. In other words, the width of the dividing lanes T1, T2 depends on the wavelength of the electromagnetic radiation 110. Moreover, as mentioned above, the patterns (the first shielding pattern 212 and the second shielding pattern 214) of the photomask 200 are shrunk and transferred onto the photoresist layer 430 with the aid of lens. Therefore, the width of the dividing lanes T1, T2 may also be adjusted based on the lens resolution and/or magnification/minification power. Suitable width of the dividing lanes T1, T2 may be selected based on the photolithography system. For example, a width of the dividing lanes T1 and a width of the dividing lanes T2 are equal to or smaller than a critical dimension (CD) of the photomask 200. Since the width of the dividing lanes T1 and the width of the dividing lanes T2 are extremely small, the width of the dividing lanes T1 and the width of the dividing lanes T2 have dimensions less than the resolution limit of the imaging system, and a pattern of the dividing lanes T1 and the dividing lanes T2 are not transferred onto the photoresist layer.

In some embodiments, the dividing lanes T1 and the dividing lanes T2 divide the first shielding pattern 212 into smaller parts 212a, 212b, 212c, 212d, 212e, 212f, and 212g. Therefore, accumulation of the charges on the first shielding pattern 212 may be better alleviated, thereby reducing the electro-static discharge (ESD) of the photomask 200.

In accordance with some embodiments of the disclosure, a photomask includes a transparent substrate and a shielding pattern disposed on the transparent substrate. The shielding pattern includes shielding island structures. The shielding island structures are separated from and spaced apart from one another by dividing lanes. The dividing lanes expose the underlying transparent substrate. The photomask is configured for a light of a wavelength, and the dividing lanes reduce or hinder a transmission of the light of the wavelength.

In accordance with some embodiments of the disclosure, a photolithography system includes a light source, a carrier stage, a photomask, and a photoresist layer. The light source is emitting an electromagnetic radiation. The carrier stage is located below the light source. The photomask is located between the light source and the carrier stage. The photomask includes a transparent and a first shielding pattern disposed on the transparent substrate. The first shielding pattern includes shielding island structures. The shielding island structures are separated from and spaced apart from one another by dividing lanes, and the dividing lanes expose the underlying transparent substrate. The photoresist layer is located over the carrier stage, wherein the electromagnetic radiation passes through the photomask to transfer a first unexposed pattern onto the photoresist layer, the first unexposed pattern corresponds to a pattern consisting of the shielding island structures and the dividing lanes, and the dividing lanes reduce or hinder a transmission of the electromagnetic radiation.

In accordance with some embodiments of the disclosure, a manufacturing process includes the following step. A photoresist layer is formed on a conductive material layer over a target substrate. A photomask is provided over the photoresist layer, wherein the photomask includes a transparent substrate, a first shielding pattern over the transparent substrate, and a second shielding pattern over the transparent substrate, wherein the first shielding pattern has a dividing lane dividing it into a plurality of parts, a gap is located between the second shielding pattern and the first shielding pattern, and the dividing lane is connected with the gap. An electromagnetic radiation is irradiated onto the photomask, wherein the electromagnetic radiation passes through the photomask to define an exposed pattern, a first unexposed pattern corresponding to the first shielding pattern, and a second unexposed pattern corresponding to the second shielding pattern in the photoresist layer, and the dividing lane reduces or hinders a transmission of the electromagnetic radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing process, comprising:
   forming a photoresist layer on a conductive material layer over a target substrate;
   providing a photomask over the photoresist layer, wherein the photomask comprises:
   a transparent substrate;
   a first shielding pattern over the transparent substrate, wherein the first shielding pattern has a dividing lane dividing it into a plurality of parts; and
   a second shielding pattern over the transparent substrate, wherein a gap is located between the second shielding pattern and the first shielding pattern, and the dividing lane is joined with the gap; and
   irradiating an electromagnetic radiation onto the photomask, wherein the electromagnetic radiation passes through the photomask to define an exposed pattern, a first unexposed pattern corresponding to the first shielding pattern, and a second unexposed pattern corresponding to the second shielding pattern in the photoresist layer, and the dividing lane reduces or hinders a transmission of the electromagnetic radiation.

2. The manufacturing process according to claim 1, wherein the electromagnetic radiation is a deep ultraviolet light, and a width of the dividing lane ranges from about 10 nm to about 16 nm.

3. The manufacturing process according to claim 1, further comprises:
   performing a development process to remove the exposed pattern; and
   performing an etching process to the conductive material layer, wherein a portion of the conductive material layer corresponding to the exposed pattern is removed to form a conductive pattern.

4. The manufacturing process according to claim 1, wherein the first shielding pattern includes recessed regions and non-recessed regions located at a side of the first shielding pattern, wherein at least one end of the dividing lane is located between two of the none-recessed regions, wherein the two of the none-recessed regions are more protruding than the other none-recessed regions adjacent to the two of the none-recessed regions.

5. The manufacturing process according to claim 1, a contour of the first shielding pattern has a shape different from a shape of a contour of the first unexposed pattern in the photoresist layer.

6. The manufacturing process according to claim 1, wherein the first unexposed pattern is formed in one integral piece.

7. The manufacturing process according to claim 1, wherein the first shielding pattern has a plurality of dividing lanes separating shielding island structures of the first shielding pattern.

8. The manufacturing process according to claim 7, wherein the plurality of dividing lanes are parallel to each other.

9. The manufacturing process according to claim 8, wherein a pattern of the dividing lane is not transferred to the first unexposed pattern after irradiating the electromagnetic radiation onto the photomask.

10. The manufacturing process according to claim 7, wherein an extending direction of a part of the plurality of dividing lanes is perpendicular with an extending direction of another part of the plurality of dividing lanes.

11. The manufacturing process according to claim 7, wherein each of the dividing lanes has a width equal to or smaller than a critical dimension of the photomask.

12. The manufacturing process according to claim 7, wherein each of the shielding island structures has an area smaller than about 500 $\mu m^2$.

13. The manufacturing process according to claim 1, further comprises:
   providing a lens located between the photomask and the photoresist layer, wherein the first shielding pattern has a size larger than a size of the first unexposed pattern.

14. The manufacturing process according to claim 4, wherein a height of the two of the none-recessed regions beyond the recessed regions is in a range between 20 nm to 100 nm.

15. The manufacturing process according to claim 1, wherein a thickness of the first shielding pattern is approximately 50 nm to 200 nm.

16. The manufacturing process according to claim 1, wherein a thickness of the second shielding pattern is approximately 50 nm to 200 nm.

17. The manufacturing process according to claim 1, wherein the dividing lane is a void street exposing the transparent substrate.

18. The manufacturing process according to claim 1, wherein a width of the gap is larger than the critical dimension of the photomask and is larger than a width of the dividing lane.

19. The manufacturing process according to claim 1, further comprises:
   performing a development process to remove the first unexposed pattern and the second unexposed pattern, wherein the photoresist layer is a negative tone photoresist.

20. The manufacturing process according to claim 3, wherein the target substrate is a bulk semiconductor substrate or a glass substrate.

* * * * *